United States Patent
Ting et al.

(10) Patent No.: US 11,139,282 B2
(45) Date of Patent: Oct. 5, 2021

(54) SEMICONDUCTOR PACKAGE STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Kuo-Chiang Ting, Hsinchu (TW); Tu-Hao Yu, Hsin-Chu (TW); Ting-Yu Yeh, Hsinchu (TW); Chia-Hao Hsu, Hsinchu (TW); Weiming Chris Chen, Taipei (TW); Wan-Yu Lee, Taipei (TW); Yu-Jie Su, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/046,713

(22) Filed: Jul. 26, 2018

(65) Prior Publication Data
US 2020/0035655 A1    Jan. 30, 2020

(51) Int. Cl.
*H01L 25/10* (2006.01)
*H01L 25/00* (2006.01)
(Continued)

(52) U.S. Cl.
CPC ...... *H01L 25/105* (2013.01); *H01L 23/49811* (2013.01); *H01L 24/10* (2013.01);
(Continued)

(58) Field of Classification Search
CPC ....... H01L 25/105; H01L 25/50; H01L 24/81; H01L 24/10; H01L 23/49811;
(Continued)

(56) References Cited

U.S. PATENT DOCUMENTS

| 4,967,313 A | 10/1990 | Berner |
| 5,525,838 A | 6/1996 | Kaneko |

(Continued)

FOREIGN PATENT DOCUMENTS

| CN | 107785690 | 3/2018 |
| JP | H10189806 A | 7/1998 |

(Continued)

OTHER PUBLICATIONS

Office Action and Search Report dated Mar. 4, 2020 issued by Taiwan Intellectual Property Office for counterpart application No. 108106036.

(Continued)

*Primary Examiner* — Charles D Garber
*Assistant Examiner* — S M Sohel Imtiaz
(74) *Attorney, Agent, or Firm* — WPAT, P.C.; Anthony King

(57) ABSTRACT

A semiconductor package structure includes a first package, a second package over the first package, a plurality of connectors between the first package and the second package and a plurality of baffle structures between the first package and the second package. The second package includes a bonding region and a periphery region surrounding the bonding region. The connectors are disposed in the bonding region to provide electrical connections between the first package and the second package. The baffle structures are disposed in the periphery region and are separated from each other.

20 Claims, 14 Drawing Sheets

(51) Int. Cl.
*H01L 23/498* (2006.01)
*H01L 23/00* (2006.01)
*H01L 25/04* (2014.01)
*H01L 25/065* (2006.01)

(52) U.S. Cl.
CPC ............ *H01L 24/81* (2013.01); *H01L 25/043* (2013.01); *H01L 25/0657* (2013.01); *H01L 25/50* (2013.01); *H01L 2224/10125* (2013.01); *H01L 2224/10155* (2013.01); *H01L 2224/81007* (2013.01); *H01L 2224/81815* (2013.01); *H01L 2225/1058* (2013.01); *H01L 2924/3511* (2013.01); *H01L 2924/3841* (2013.01)

(58) Field of Classification Search
CPC ... H01L 2924/3511; H01L 2224/10155; H01L 2224/10125; H01L 2225/1058; H01L 2224/81007; H01L 2924/3841; H01L 2224/81815
See application file for complete search history.

(56) References Cited

U.S. PATENT DOCUMENTS

| | | | |
|---|---|---|---|
| 8,802,504 B1* | 8/2014 | Hou | H01L 23/49811 |
| | | | 438/125 |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 10,178,769 B2 | 1/2019 | Min et al. | |
| 2004/0212069 A1* | 10/2004 | Chen | H01L 25/0657 |
| | | | 257/686 |
| 2008/0185731 A1* | 8/2008 | Gokan | H01L 24/16 |
| | | | 257/777 |
| 2008/0246135 A1* | 10/2008 | Wong | H05K 1/185 |
| | | | 257/686 |
| 2009/0243065 A1* | 10/2009 | Sugino | H01L 25/0657 |
| | | | 257/686 |
| 2011/0204476 A1* | 8/2011 | Kang | H01L 23/16 |
| | | | 257/532 |
| 2012/0235303 A1* | 9/2012 | Liu | H01L 23/562 |
| | | | 257/773 |
| 2014/0001644 A1* | 1/2014 | Yu | H01L 21/563 |
| | | | 257/774 |
| 2014/0203456 A1* | 7/2014 | Hsu | H01L 23/49833 |
| | | | 257/777 |
| 2014/0374921 A1* | 12/2014 | Yu | H01L 23/49816 |
| | | | 257/777 |
| 2015/0282307 A1* | 10/2015 | Shimizu | H01L 23/5383 |
| | | | 174/264 |
| 2016/0064357 A1* | 3/2016 | Choe | H01L 23/481 |
| | | | 257/774 |
| 2016/0066426 A1* | 3/2016 | Chen | H01L 23/49816 |
| | | | 361/820 |
| 2017/0053886 A1 | 2/2017 | Uzoh et al. | |
| 2017/0125359 A1* | 5/2017 | Sakai | H01L 23/5385 |
| 2018/0026014 A1 | 1/2018 | Yew et al. | |

FOREIGN PATENT DOCUMENTS

| | | |
|---|---|---|
| JP | 2011142185 | 7/2011 |
| TW | 201742208 A | 12/2017 |

OTHER PUBLICATIONS

Office Action and Search Report dated Dec. 16, 2020 issued by China National Intellectual Property Administration for counterpart application No. 201910220498.5.
English Abstract Translation of Foreign Reference JP2011142185.
English Abstract Translation of Foreign Reference JPH10189806.
U.S. Pat. No. 10,178,769 is the counterpart to Foreign Reference CN 107785690.

\* cited by examiner

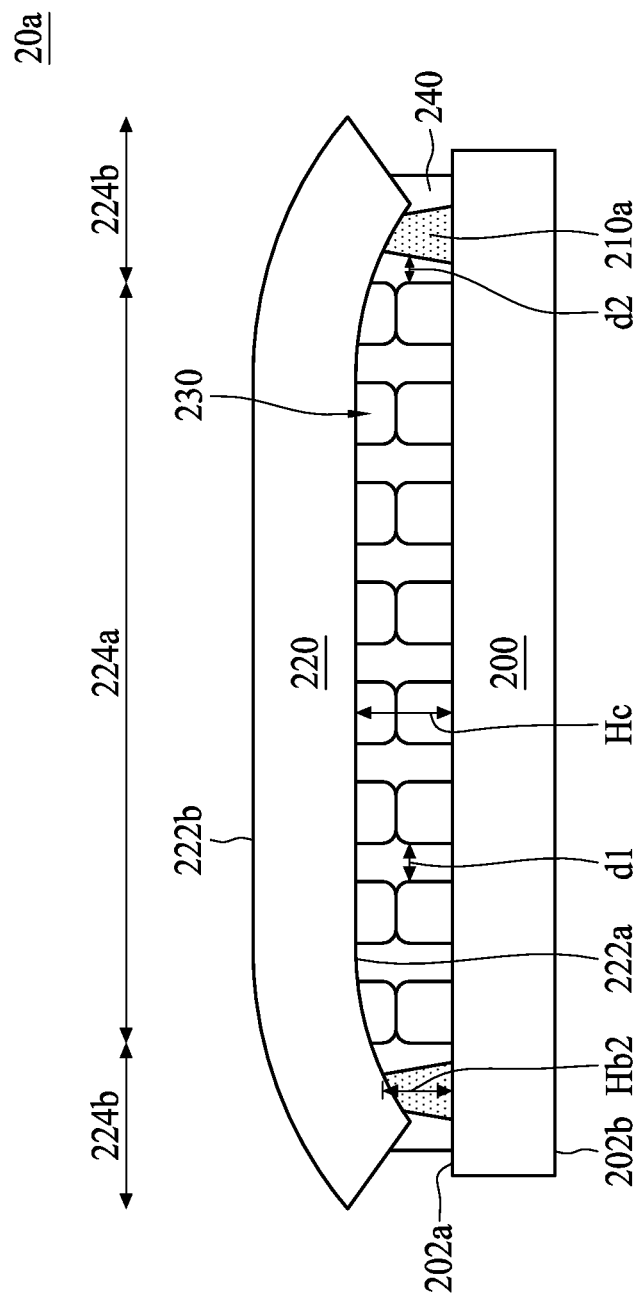

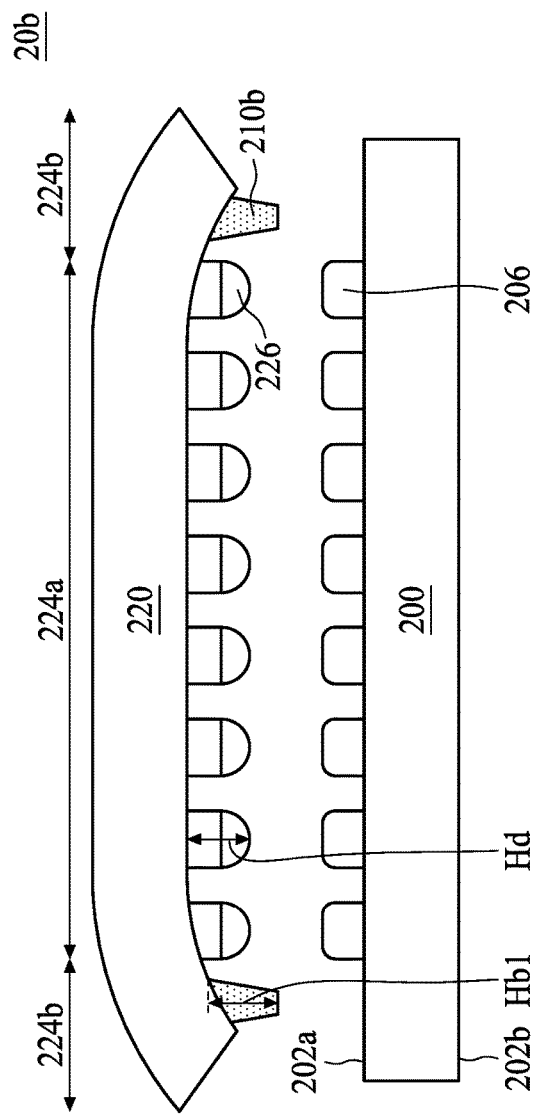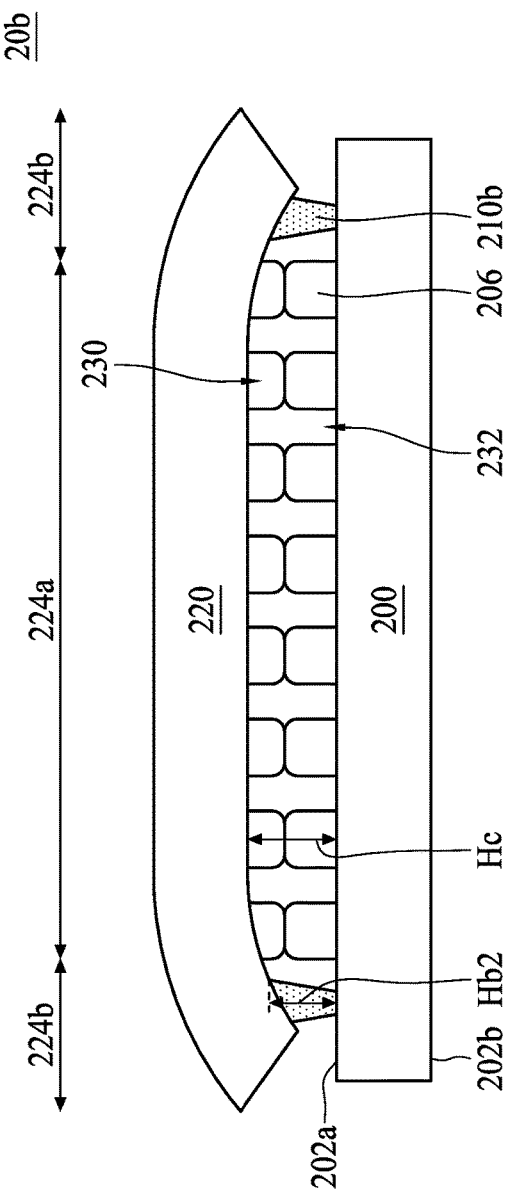

SEMICONDUCTOR PACKAGE STRUCTURE AND METHOD FOR MANUFACTURING THE SAME

BACKGROUND

The semiconductor integrated circuit (IC) industry has experienced rapid growth. Technological advances in IC materials and design have produced generations of ICs where each generation of ICs includes smaller and more complex circuits than those of the previous generation. The smaller and more complex circuits are two-dimensional (2D) in nature, in that the area occupied by the integrated IC's components is on the surface of the semiconductor wafer. However, 2DIC formation faces physical limits. One of these limits is the minimum area needed to accommodate the integrated components. In addition, when more devices are included in one chip or die, more complex designs are required.

To enable further increases in circuit density, three-dimensional integrated circuits (3DIC) have been developed. In a typical 3DIC formation process, two chips are bonded together and electrical connections are formed between the chips. Bonding two chips may be accomplished by, for example, attaching one chip on top of the other, a process known as stacking. The stacked chips are then bonded to a carrier substrate and wire bonds electrically coupling the stacked chips and the carrier substrate may be formed. However, such approach requires a carrier substrate larger than the chips for the wire bonding. More recent attempts therefore have focused on flip-chip interconnections and the use of conductive balls or bumps to form a connection between the chips and the underlying substrate, thereby allowing high wiring density in a relatively small package.

Typically, chip stacking uses solder joints involving solder, flux and underfill. Processes for these elements incur issues related to limitations on pitch, joint height, and flux residue.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A to 4C are schematic drawings illustrating a semiconductor package structure at various fabrication stages constructed according to aspects of one or more embodiments of the present disclosure.

FIGS. 5A to 5C are schematic drawings illustrating a semiconductor package structure at various fabrication stages constructed according to aspects of one or more embodiments of the present disclosure.

DETAILED DESCRIPTION

Figure 1:
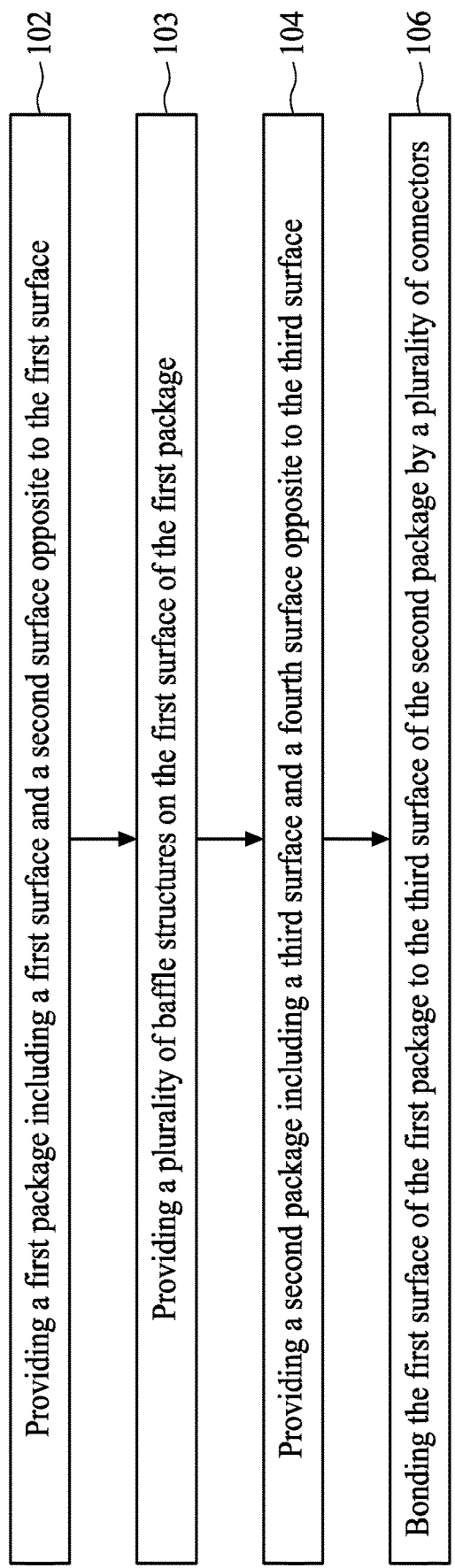
FIG. 1 is a flow chart representing a method for manufacturing a semiconductor package structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 100° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In 3DIC, a chip or a package carrying an integrated circuit is commonly mounted on a package carrier, such as a substrate or a circuit board, that provides electrical connections from the chip to the exterior of the package. In one such packaging arrangement called flip chip mounting, the semiconductor chip may be mounted to a bump pattern of contact pads formed on a semiconductor package substrate. In some embodiments, an operation sequence includes forming solder bumps on bonding pads or other signal connection devices on a semiconductor chip, applying flux to at least one of the package substrate and the semiconductor chip, and aligning the chip with the package substrate. The components are then joined during a reflow operation. An underfill is applied or dispensed between the chip and the package substrate after a flux cleaning operation.

To incorporate more solder bumps in order to meet the packaging requirements, the distance between neighboring solder bumps is reduced. In some embodiments, as the pitch between the solder bumps is reduced to less than 100 micrometers (μm), which can be referred to as "fine pitch," problems can arise. For example, there is an increased risk that the solder bumps that are adjacent to each other could unintentionally make contact and bridge during the reflow operation, resulting in an undesired short circuit. Various approaches have been developed to solve this problem. For example, elongated solder bumps that are significantly greater in height than in lateral widths are provided in some embodiments. However, this creates a requirement for a demanding degree of accuracy of the manufacturing operation, and the corresponding manufacturing operation is complicated. In addition, the risk of bridging still exists.

Further, a change in temperature can cause die warpage. In some embodiments, inadequate bonding of the die to the package occurs. In some embodiments, warpage appears to occur at a periphery of the die, especially at the corners. Compression forces during the bonding process can be concentrated along the periphery or at a corner of the die, causing the solder material to be squeezed out of bump region, resulting in bridging between adjacent solder bumps in the periphery or corner region. An undesired short circuit is thereby formed.

The present disclosure provides a semiconductor package structure including a plurality of baffle structures serving as reinforcement against the compression forces caused by die warpage. In some embodiments, the baffle structures are disposed over a periphery region of a die or a region of the substrate corresponding to the periphery region of the die.

FIG. 1 is a flow chart representing a method for manufacturing a semiconductor package structure 10 according to aspects of the present disclosure. The method for manufacturing the semiconductor package structure 10 includes an operation 102, providing a first package, wherein the first package includes a first surface and a second surface opposite to the first surface. The method 10 further includes an operation 103, providing a plurality of baffle structures on the first surface of the first package. The method 10 further includes an operation 104, providing a second package including a third surface and a fourth surface opposite to the third surface. The method 10 further includes an operation 106, bonding the first surface of the first package to the third surface of the second package by a plurality of connectors. The method 10 will be further described according to one or more embodiments. It should be noted that the operations of the method 10 may be rearranged or otherwise modified within the scope of the various aspects. It should further be noted that additional processes may be provided before, during, and after the method 10, and that some other processes may be only briefly described herein. Thus, other implementations are possible within the scope of the various aspects described herein.

Figure 2:
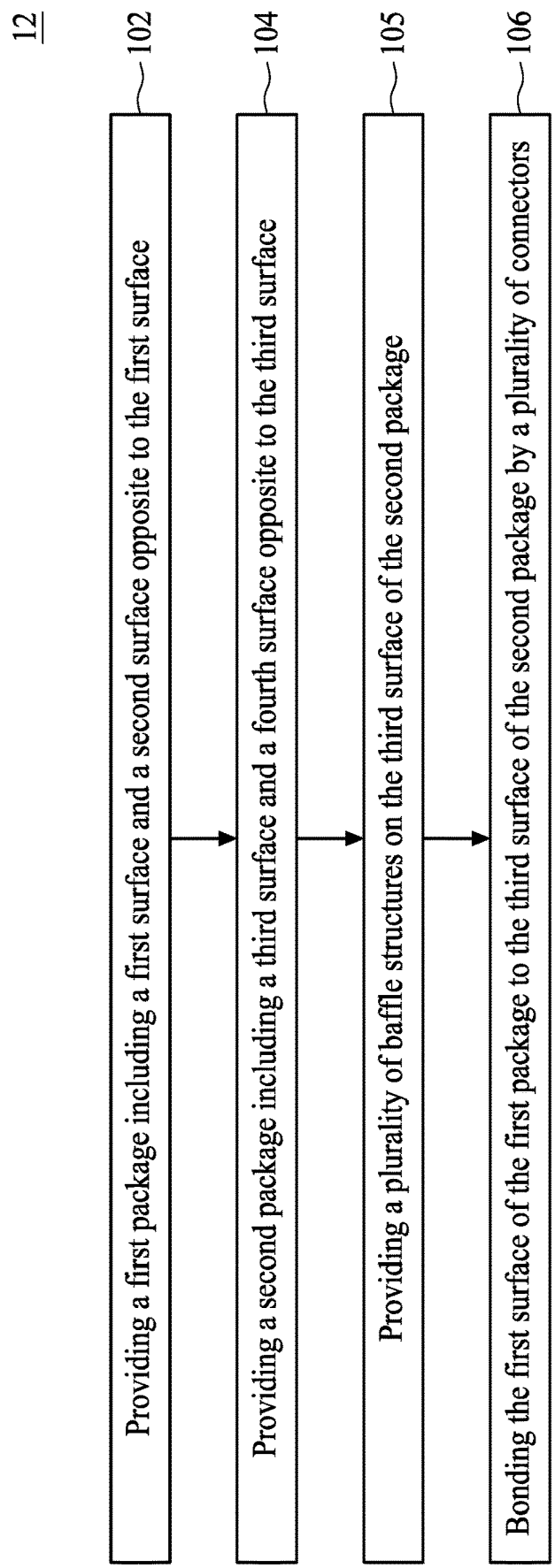
FIG. 2 is a flow chart representing a method for manufacturing a semiconductor package structure according to aspects of the present disclosure.

FIG. 2 is a flow chart representing a method for manufacturing a semiconductor package structure 12 according to aspects of the present disclosure. The method for manufacturing the semiconductor package structure 12 includes an operation 102, providing a first package, wherein the first package includes a first surface and a second surface opposite to the first surface. The method 12 further includes an operation 104, providing a second package including a third surface and a fourth surface opposite to the third surface. The method 12 further includes an operation 105, providing a plurality of baffle structures on the third surface of the second package. The method 12 further includes an operation 106, bonding the first surface of the first package to the third surface of the second package by a plurality of connectors. The method 12 will be further described according to one or more embodiments. It should be noted that the operations of the method 12 may be rearranged or otherwise modified within the scope of the various aspects. It should further be noted that additional processes may be provided before, during, and after the method 12, and that some other processes may be only briefly described herein. Thus, other implementations are possible within the scope of the various aspects described herein.

Figure 3:
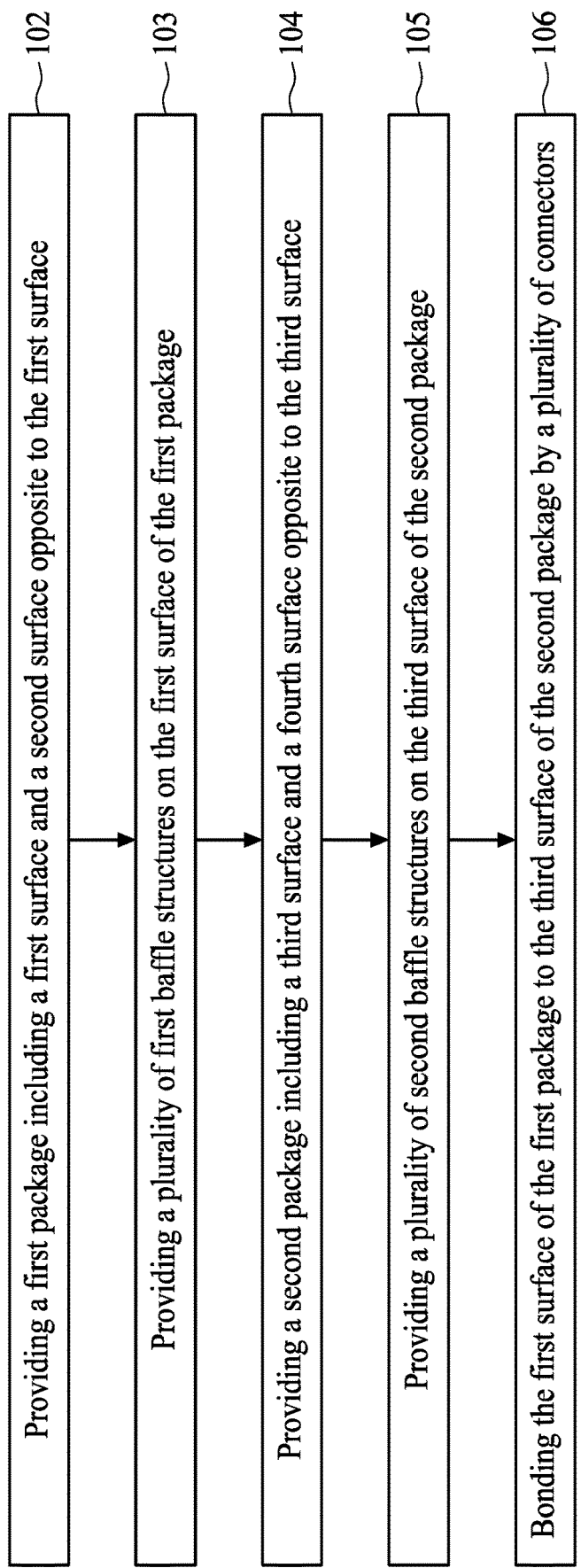
FIG. 3 is a flow chart representing a method for manufacturing a semiconductor package structure according to aspects of the present disclosure.

FIG. 3 is a flow chart representing a method for manufacturing a semiconductor package structure 14 according to aspects of the present disclosure. The method for manufacturing the semiconductor package structure 14 includes an operation 102, providing a first package, wherein the first package includes a first surface and a second surface opposite to the first surface. The method 14 further includes an operation 103, providing a plurality of first baffle structures on the first surface of the first package. The method 14 further includes an operation 104, providing a second package including a third surface and a fourth surface opposite to the third surface. The method 14 further includes an operation 105, providing a plurality of second baffle structures on the third surface of the second package. The method 14 further includes an operation 106, bonding the first surface of the first package to the third surface of the second package by a plurality of connectors. In some embodiments, the first baffle structures and the second baffle structures are alternately arranged. The method 14 will be further described according to one or more embodiments. It should be noted that the operations of the method 14 may be rearranged or otherwise modified within the scope of the various aspects. It should further be noted that additional processes may be provided before, during, and after the method 14, and that some other processes may be only briefly described herein. Thus, other implementations are possible within the scope of the various aspects described herein.

Figure 4A:
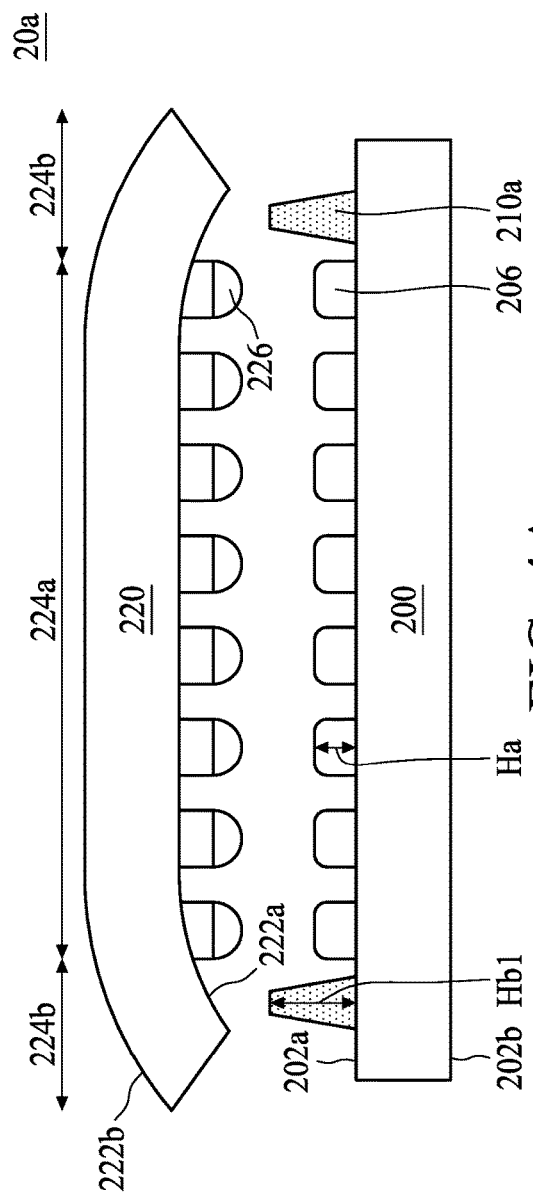
Figure 4B:
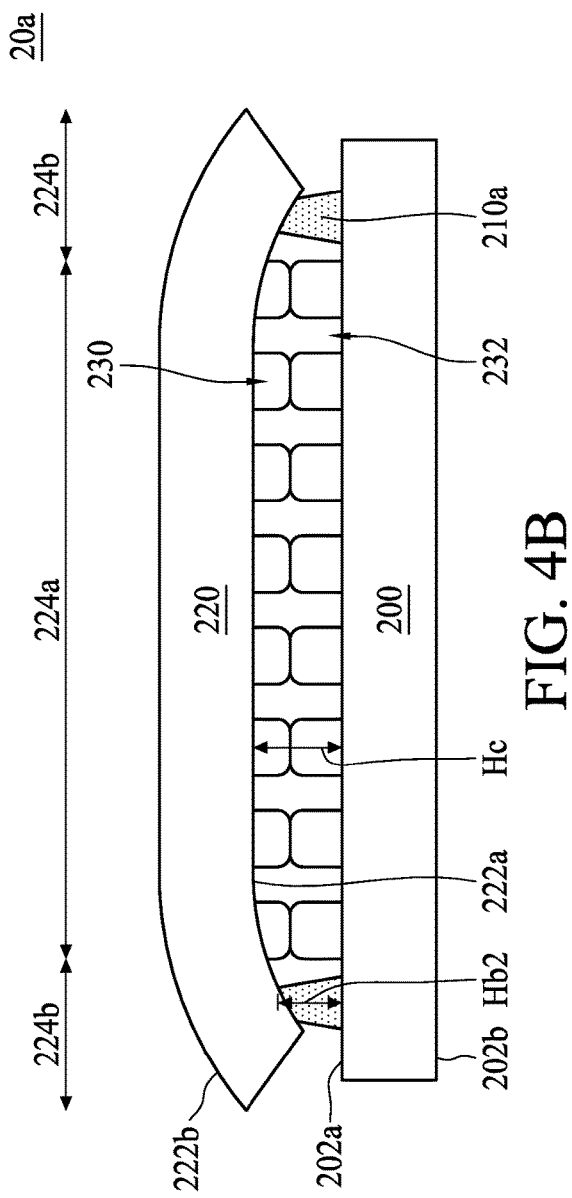

FIGS. 4A to 4C are schematic drawings illustrating a semiconductor package structure 20a at various fabrication stages constructed according to aspects of one or more embodiments of the present disclosure. In addition, FIGS. 4A to 4C can also be cross-sectional views taken along line A-A' of FIG. 10A. According to operation 102, a first package 200 is provided. In some embodiments, the first package 200 can include a carrier or a substrate of one or more packages. The first package 200 includes a first surface 202a and a second surface 202b opposite to the first surface 202a.

In some embodiments, the first package 200 may be a package substrate. In some embodiments, the first package 200 may be a board, such as a printed circuit board (PCB). A plurality of pre-solder layers 206 is formed on a plurality of contact pads (not shown) and/or conductive traces can be formed over the first surface 202a of the first package 200. The pre-solder layer 206 may be a eutectic solder material including alloys of tin (Sn), lead (Pb), silver (Ag), copper (Cu), nickel (Ni), bismuth (Bi), or combinations thereof. In some embodiments, the pre-solder layers 206 have a height Ha, as shown in FIG. 4A. In some embodiments, a plurality of baffle structures 210a are disposed on the first surface 202a of the first package 200, according to operation 103 of the method 10. In some embodiments, the baffle structures 210a are dispensed over the first surface 202a of the first package 200, like stalagmites, but the disclosure is not limited thereto. In some embodiments, the baffle structures 210a are formed after the forming the pre-solder layer 206. The baffle structures 210a include a height Hb1. In some embodiments, the height Hb1 of the baffle structures 210a is greater than the height Ha of the pre-solder layers 206, but the disclosure is not limited thereto. In some embodiments, the height Hb1 of the baffle structures 210a is between approximately 70 micrometers (μm) and 125 μm, but the disclosure is not limited thereto. Each of the baffle structures 210a includes a bottom portion disposed on the first surface 202a of the first package 200, and includes a top portion protruding from the first surface 202a of the first package 200. In some embodiments, because the baffle structures 210a are dispensed on the first surface 202a, a diameter of the top of the baffle structures 210a is less than a diameter of the bottom of the baffle structures 210a, but the disclosure is not limited thereto. The baffle structures 210a can include conductive materials such as Cu, semiconductive materials, or insulating materials such as polymer. The materials used to form the baffle structures 210a and locations of the baffle structures 210a are described in detail below.

Still referring to FIG. 4A, a second package 220 is provided according to operation 104 of the method 10. In some embodiments, the second package 220 can be a chip (which is sometimes referred to as a die). The chip may be an integrated circuit (IC) chip, a system on chip (SoC), or a portion thereof, and may include various passive and active microelectronic devices such as resistors, capacitors, inductors, diodes, metal-oxide-semiconductor field effect transistors (MOSFETs), complementary metal-oxide-semiconductor (CMOS) devices, bipolar junction transistors (BJTs), laterally diffused MOS (LDMOS) transistors, high power MOS transistors, or other types of transistors. The chip may include a microelectromechanical system (MEMS) device and/or a nanoelectromechanical system (NEMS) device. In some embodiments, the second package 220 includes the chip, and the chip includes a wafer (not shown). The wafer may be, for example but not limited thereto, a silicon (Si) wafer. The wafer may alternatively be made of some other suitable elementary semiconductor, such as diamond or germanium (Ge); a suitable compound semiconductor, such as silicon carbide (SiC), indium arsenide (InAs), or indium phosphide (InP); or a suitable alloy semiconductor, such as SiGeC, gallium arsenic phosphide (GaAsP), or GaInP. The wafer may include various doped regions (not shown), isolation structures (not shown), other devices, or a combination thereof.

In some embodiments, the second package 220 includes a third surface 222a and a fourth surface 222b opposite to the third surface 222a. The second package 220 can also have an interconnect structure (not shown) formed over the third surface 222a. The interconnect structure may include a plurality of patterned dielectric layers and conductive layers that provide interconnections between the various devices of the second package 220. The second package 220 further includes a plurality of bonding structures 226 disposed over the third surface 222a of the second package 220, and the bonding structures 226 may be electrically connected to the various devices of the second package 220 through the interconnect structure. In some embodiments, the bonding structures 226 include dummy bonding structures.

In some embodiments, the second package 220 includes at least a bonding region 224a and a periphery region 224b defined over the third surface 222a. The bonding region 224a is a region defined and configured for accommodating the plurality of bonding structures 226 (including dummy bonding structures), and the periphery region 224b is a region that is not configured for accommodating the bonding structures 226. In some embodiments, the periphery region 224b surrounds the bonding region 224a, but the disclosure is not limited thereto. In some embodiments, a passivation can be formed on bonding pads (not shown) of the interconnect structure and patterned to partially cover the bonding pads. An under-bump-metallurgy (UBM) layer (not shown) including a diffusion barrier layer and a seed layer can be formed on each of the bonding pads, and a Cu post can be formed on the UBM layer. As used throughout this disclosure, the term "Cu post" is intended to include substantially a post including pure Cu, Cu containing unavoidable impurities, and Cu alloys containing minor amounts of elements such as tantalum (Ta), indium (In), tin (Sn), zinc (Zn), manganese (Mn), titanium (Ti), germanium (Ge), strontium (Sr), platinum (Pt), aluminum (Al), or zirconium (Zr). The method for forming the Cu post may include sputtering, printing, electro-plating, and commonly used chemical vapor deposition (CVD) methods. In some embodiments, a solder layer can be formed on each Cu post. The solder layer can be applied by a plating method. In alternative embodiments, the solder layer may be applied by screen printing or dipping. In some embodiments, the solder layer may be formed from lead free (Pb-free) materials. For example, in an embodiment, the solder layer can be Pb-free solder material such as tin-silver-copper (SnAgCu or SAC) or other Pb-free materials, but the disclosure is not limited thereto. In other embodiments, the solder layer can include a Pb-based solder material such as PbSn, but the disclosure is not limited thereto. In some embodiments, a cap layer can be formed between the Cu post and the solder layer for preventing Cu diffusion into the solder layer. In some embodiments, each of the bonding structures 226 can include the Cu post, the cap layer and the solder layer, but the disclosure is not limited thereto.

Referring to FIG. 4B, subsequently, the first package 200 and the second package 220 are bonded by a plurality of connectors 230 according to operation 106 of the method 10. In some embodiments, the second package 220 can be flipped upside down (vertically rotated 180 degrees), and the third surface 222a of the second package 220 is bonded to the first surface 202a of the first package 200. Since the third surface 222a (an active surface in some embodiments) of the second package 220 is bonded to the first surface 202a of the first package 200, the fourth surface 222b of the second package 220 is visible in the top view of the semiconductor package structure 20a. In some embodiments, the bonding structures 226 are aligned with and brought into contact with the pre-solder layers 206 over the first package 200. The bonding structures 226 and the pre-solder layers 206 are then bonded by a reflow operation to form the plurality of connectors 230 producing electrical coupling between the first package 200 and the second package 220, as shown in FIG. 4B. In other words, the first surface 202a of the first package 200 is bonded to the third surface 222a of the second package 220 by the plurality of connectors 230. In some embodiments, the connectors 230 may include dummy connectors.

Still referring to FIGS. 4A and 4B, in some embodiments, warpage can be induced in the second package 220 during joining the first package 200 and the second package and during forming of the bonding structures 226, and thus the periphery region 224b of the second package 220 may be bent. In some embodiments, the periphery region 224b of the second package 220 is bent toward the first package 200 and thereby may result in a compression force toward the first package 200 during the bonding. The compression force exerted in the peripheral region 224b can unduly deform the solder layer of the bonding structures 226, causing solder bridging or bump bridging. It is worth noting that the baffle structures 210a, which can be formed in a region corresponding to the periphery region 224b, provide reinforcement against the compression force from the second package 220. Therefore, the bonding structures 226 near the periphery region 224b may avoid being squeezed by the compression force, and thus bump bridge issue is mitigated. Further, a mechanical strength of the baffle structures 210a is sufficient to resist the compression force from the second package 220. However, the height Hb1 of the baffle structures 210a may be reduced to a height Hb2 after the bonding. In some embodiments, the height Hb2 of the baffle structures 210a is less than a spacing distance between the first package 200 and the second package 220 after the bonding. In some embodiments, the height Hb2 of the baffle structures 210a is less than a height Hc of the connectors 230 after the bonding. In some embodiments, the baffle structures 210a include a consistent height Hb2 after the bonding. In some embodiments, the height Hb2 of the baffle structures 210a after the bonding is not consistent. For example but not limited thereto, the height Hb2 of a side of the baffle structures 210a facing the connectors 230 is greater than the height Hb2 of a side of the baffle structures 210a opposite to the connectors 230, as shown in FIG. 4B.

Referring to FIGS. 4B and 4C, an underfill 240 is next dispensed or injected into a space 232 between the first package 200, the second package 220, the connectors 230, and the baffle structures 210a. The underfill 240 is injected to fill the space 232 in order to reduce stress exerted on the bonded structures after the bonding. In some embodiments, the underfill 240 covers not only the first surface 202a of the first package 200 and the third surface 222a of the second package 220, but also surfaces of the connectors 230 and surfaces of the baffle structures 210a, as shown in FIG. 4C. In some embodiments, the underfill 240 can include polymers such as resin epoxy, or other suitable materials. In some embodiments, the underfill 240 can include fillers, such as silica, to adjust the mechanical strength of the underfill 240. It is worth noting that the baffle structures 210a are separated from each other such that the underfill 240 can be smoothly injected to fill the space 232. In some embodiments, a value of Young's modulus of the baffle structures 210a is different from a value of Young's modulus of the underfill 240. For example, Young's modulus of the baffle structure 210a can be 3 GPa, and Young's modulus of the underfill 240 can be 10 GPa, but the disclosure is not limited thereto. In addition, Young's modulus of the connectors 230 (including bonding structures 226 and the pre-solder layers 206) is greater than 30 GPa, and Young's modulus of dielectric materials such as SiO or SiN is over 50 GPa. In some embodiments, the baffle structures 210a can include materials having Young's modulus less than elements of the semiconductor package structure 20a, such as the connectors 230, the underfill 240, and the dielectric materials such as SiO or SiN.

Figure 5C:
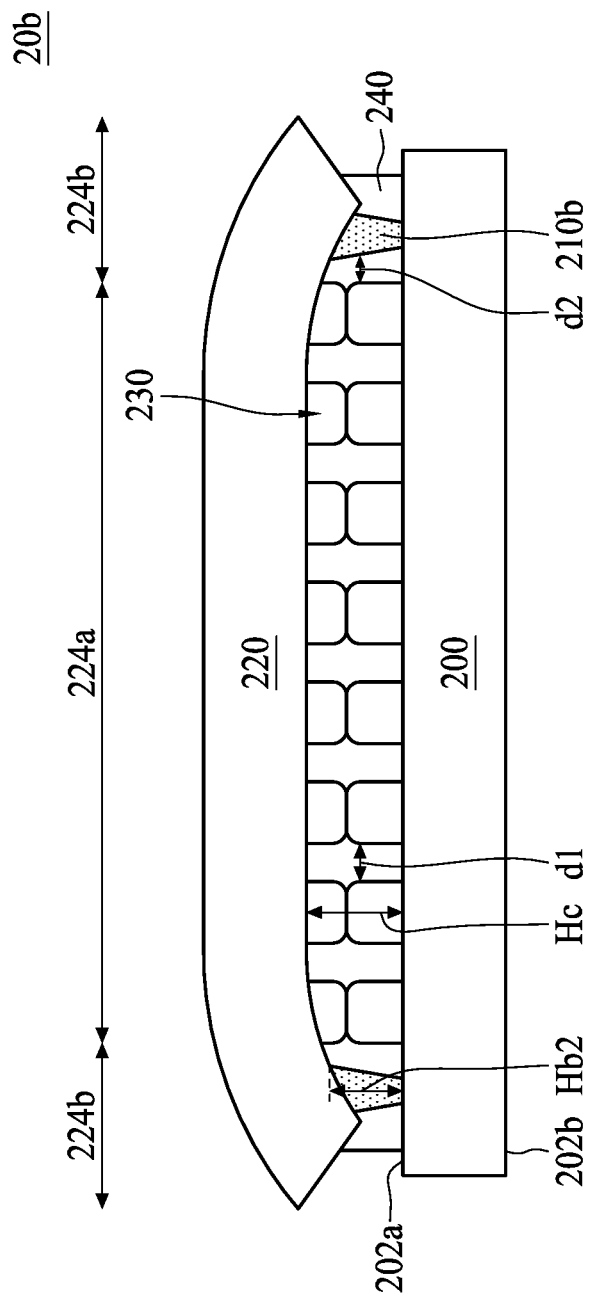

FIGS. 5A to 5C are schematic drawings illustrating a semiconductor package structure 20b at various fabrication stages constructed according to aspects of one or more embodiments of the present disclosure. In addition, and FIGS. 5A to 5C can also be cross-sectional views taken along line A-A' of FIG. 10A. Further, similar elements in FIGS. 4A to 4C and FIGS. 5A to 5C can include similar materials; therefore, such redundant details are omitted in the interest of brevity, and only the differences are mentioned. Referring to FIG. 5A, a first package 200 is provided according to operation 102 of the method 12. A plurality of pre-solder layers 206 are formed on a plurality of contact pads (not shown) and/or conductive traces can be formed over the first surface 202a of the first package 200.

Still referring to FIG. 5A, a second package 220 is provided according to operation 104 of the method 12. The second package 220 includes a third surface 222a and a fourth surface 222b opposite to the third surface 222a. In some embodiments, the second package 220 can have an interconnect structure (not shown) formed over the third surface 222a. In some embodiments, the second package 220 includes at least a bonding region 224a and a periphery region 224b defined over the third surface 222a. The bonding region 224a is a region defined and configured for accommodating a plurality of bonding structures 226, and the periphery region 224b is a region that is not configured for accommodating the bonding structures 226. In some embodiments, the periphery region 224b surrounds the bonding region 224a, but the disclosure is not limited thereto. In some embodiments, each of the bonding structures 226 includes at least a Cu post and a solder layer, but the disclosure is not limited thereto.

In some embodiments, a plurality of baffle structures 210b are disposed on the third surface 222a in the periphery region 224b of the second package 220, according to operation 105 of the method 12. In some embodiments, the baffle structures 210b are dispensed over the third surface 222a of the second package 220, but the disclosure is not limited thereto. In some embodiments, the baffle structures 210b are formed after the forming the bonding structures 226. The baffle structures 210b include a height Hb1. In some embodiments, the height Hb1 of the baffle structures 210b is greater than a height Hd of the bonding structures 226, but the disclosure is not limited thereto. The baffle structures 210b respectively include a bottom portion disposed on the third surface 222a of the second package 220, and a top portion protruding from the third surface 222a of the second package 220. In some embodiments, a diameter of the top of the baffle structures 210b is less than a diameter of the bottom of the baffle structures 210b, but the disclosure is not limited thereto. The baffle structures 210b can include conductive materials such as Cu, semiconductive materials, or insulating materials such as polymer. The materials used to form the baffle structures 210b and locations of the baffle structures 210b are described in detailed below.

Referring to FIG. 5B, the first package 200 and the second package 220 are bonded by a plurality of connectors 230 according to operation 106 of the method 12. In some embodiments, the second package 220 can be flipped upside down (vertically rotated 180 degrees), and the third surface 222a of the second package 220 is bonded to the first surface 202a of the first package 200. Since the third surface 222a (an active surface in some embodiments) of the second package 220 is bonded to the first surface 202a of the first package 200, the fourth surface 222b of the second package 220 is visible in the top view of the semiconductor package structure 20b. In some embodiments, the bonding structures 226 are aligned with and brought into contact with the pre-solder layers 206 over the first package 200. The bonding structures 226 and the pre-solder layers 206 are then bonded by a reflow operation to form the plurality of connectors 230 producing electrical coupling between the first package 200 and the second package 220, as shown in FIG. 5B. In other words, the first surface 202a of the first package 200 is bonded to the third surface 222a of the second package 220 by the plurality of connectors 230.

Still referring to FIGS. 5A and 5B, in some embodiments, warpage is induced in the second package 220 during joining the first package 200 and the second package 220 and during the forming of the bonding structures 226, and thus the periphery region 224b of the second package 220 may be bent. In some embodiments, the periphery region 224b of the second package 220 is bent toward the first package 200 and thereby may result in a compression force from the first package 200 during the bonding. The compression force exerted in the peripheral region 224b can unduly deform the solder layer of the bonding structures 226, causing solder bridging or bump bridging. It is worth noting that the baffle structures 210b, which are formed in the periphery region 224b, provide reinforcement against the compression force from the first package 200. Therefore, the bonding structures 226 near the periphery region 224b may avoid being squeezed by the compression force, and thus bump bridge issue is mitigated. In some embodiments, a mechanical strength of the baffle structures 210b is sufficient to resist the compression force from the first package 200. However, the height Hb1 of the baffle structures 210b may be reduced to a height Hb2 after the bonding. In some embodiments, the height Hb2 of the baffle structures 210b is less than a spacing distance between the first package 200 and the second package 220 after the bonding. In some embodiments, the height Hb2 of the baffle structures 210b is less than a height Hc of the connectors 230 after the bonding. In some embodiments, the baffle structures 210b include a consistent height Hb2 after the bonding. In some embodiments, the height Hb2 of the baffle structures 210b after the bonding is not consistent. For example but not limited thereto, the height Hb2 of a side of the baffle structures 210b facing the connectors 230 is greater than the height Hb2 of a side of the baffle structures 210b opposite to the connectors 230, as shown in FIG. 5B.

Referring to FIG. 5C, an underfill 240 is injected or applied into a space 232 between the first package 200, the second package 220, the connectors 230, and the baffle structures 210b. The underfill 240 is injected to fill the space 232 in order to reduce stress exerted on the bonded structures after the bonding. In some embodiments, the underfill 240 covers not only the first surface 202a of the first package 200 and the third surface 222a of the second package 220, but also surfaces of the connectors 230 and surfaces of the baffle structures 210b, as shown in FIG. 5C. It is worth noting that the baffle structures 210b are separated from each other such that the underfill 240 can be smoothly injected to fill the space 232.

Figure 6A:
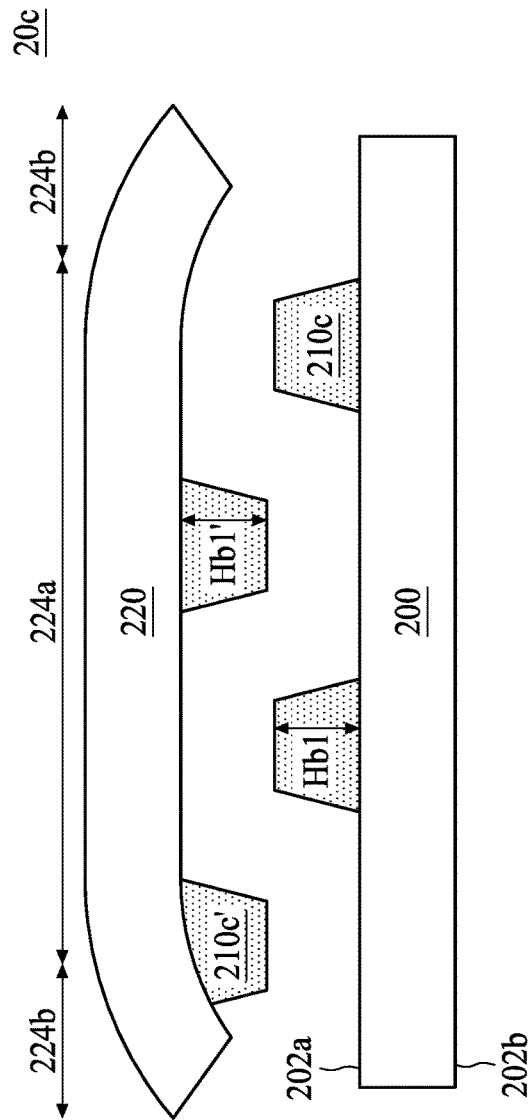
FIGS. 6A to 6C are schematic drawings illustrating a semiconductor package structure at various fabrication stages constructed according to aspects of one or more embodiments of the present disclosure.
Figure 6B:
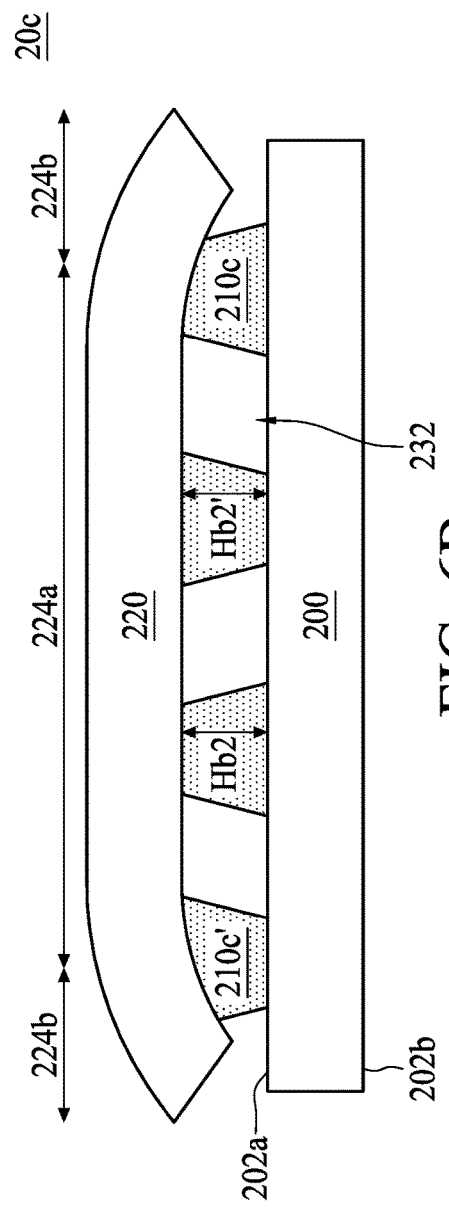
Figure 6C:
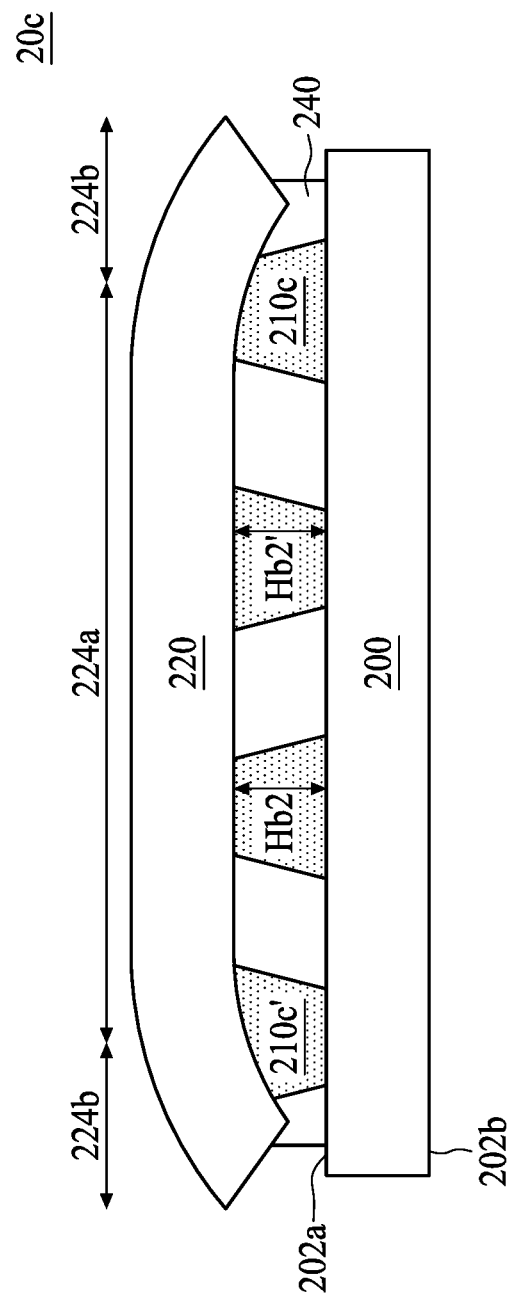

FIGS. 6A to 6C are schematic drawings illustrating a semiconductor package structure 20c at various fabrication stages constructed according to aspects of one or more embodiments of the present disclosure. In addition, and FIGS. 6A to 6C can also be cross-sectional views taken along line C-C' of FIG. 10A. Further, similar elements in FIGS. 4A to 4C and FIGS. 6A to 6C can include similar materials; therefore, such redundant details are omitted in the interest of brevity, and only the differences are mentioned. Referring to FIG. 6A, a first package 200 is provided according to operation 102 of the method 14. A plurality of pre-solder layers (not shown) are formed on a plurality of contact pads (not shown) and/or conductive traces can be formed over the first surface 202a of the first package 200. It should be noted that though the pre-solder layers are not shown in FIG. 6A, those skilled in the art would easily realize locations and morphologies of the pre-solder layers according to FIGS. 4A and 5A.

In some embodiments, a plurality of first baffle structures 210c are disposed on the first surface 202a of the first package 200, according to operation 103 of the method 14. The first baffle structures 210c include a height Hb1. In some embodiments, the first baffle structures 210c are dispensed over the first surface 202a of the first package 200, but the disclosure is not limited thereto. In some embodiments, the first baffle structures 210c are formed after the forming the bonding pre-solder layer. As mentioned above, the height Hb1 of the first baffle structures 210c can be greater than the height of the pre-solder layers, but the disclosure is not limited thereto. Each of the first baffle structures 210c includes a bottom portion disposed on the first surface 202a of the first package 200, and includes a top portion protruding from the first surface 202a of the first package 200. In some embodiments, a diameter of the top of the first baffle structures 210c is less than a diameter of the bottom of the first baffle structures 210c, but the disclosure is not limited thereto. The first baffle structures 210c can include conductive materials such as Cu, semiconductive materials, or insulating materials such as polymer. The material and locations of the first baffle structures 210c are described in detail below.

Still referring to FIG. 6A, a second package 220 is provided according to operation 104 of the method 14. The second package 220 includes a third surface 222a and a fourth surface 222b opposite to the third surface 222a. In some embodiments, the second package 220 can have an interconnect structure (not shown) formed over the third surface 222a. In some embodiments, the second package 220 includes at least a bonding region 224a and a periphery region 224b defined over the third surface 222a. The bonding region 224a is a region defined and configured for accommodating a plurality of bonding structures (not shown), and the periphery region 224b is a region that is not configured for accommodating the bonding structures. In some embodiments, the periphery region 224b surrounds the bonding region 224a, but the disclosure is not limited thereto. In some embodiments, each of the bonding structures includes at least a Cu post and a solder layer, but the disclosure is not limited thereto. It should be noted that though the bonding structures are not shown in FIG. 6A, those skilled in the art would easily realize locations and morphologies of the bonding structures according to FIGS. 4A and 5A.

In some embodiments, a plurality of second baffle structures 210c' are disposed on the third surface 222a in the periphery region 224b of the second package 220, according to operation 105 of the method 14. In some embodiments, the second baffle structures 210c' are dispensed over the third surface 222a of the second package 220, but the disclosure is not limited thereto. In some embodiments, the second baffle structures 210c' are formed after the forming the bonding structures. The second baffle structures 210c' include a height Hb1'. In some embodiments, the height Hb1' of the second baffle structures 210c' is greater than a height of the bonding structures, but the disclosure is not limited thereto. In some embodiments, the height Hb1' of the second baffle structures 210c' is equal to the height Hb1 of the first baffle structures 210c, but the disclosure is not limited thereto. The second baffle structures 210c' respectively include a bottom portion disposed on the third surface 222a of the second package 220, and a top portion protruding from the third surface 222a of the second package 220. In some embodiments, a diameter of the top of the second baffle structures 210c' is less than a diameter of the bottom of the second baffle structures 210c', but the disclosure is not limited thereto. The second baffle structures 210c' can include conductive materials such as Cu, semiconductive materials, or insulating materials such as polymer. The materials and locations of the second baffle structures 210c' are described in detailed below. It should be noted that each of the first baffle structure 210c and each of the second baffle structures 210c' are alternately arranged, as shown in FIG. 6A.

Referring to FIG. 6B, the first package 200 and the second package 220 are bonded by a plurality of connectors 230 according to operation 106 of the method 12. In some embodiments, the second package 220 can be flipped upside down (vertically rotated 180 degrees), and the third surface 222a of the second package 220 is bonded to the first surface 202a of the first package 200. Since the third surface 222a (an active surface in some embodiments) of the second package 220 is bonded to the first surface 202a of the first package 200, the fourth surface 222b of the second package 220 is visible in the top view of the semiconductor package structure 20c. In some embodiments, the bonding structures are aligned with and brought into contact with the pre-solder layers over the first package 200. The bonding structures and the pre-solder layers are then bonded by a reflow operation to form the plurality of connectors producing electrical coupling between the first package 200 and the second package 220, as shown in FIG. 6B. In other words, the first surface 202a of the first package 200 is bonded to the third surface 222a of the second package 220 by the plurality of connectors.

Still referring to FIGS. 6A and 6B, in some embodiments, warpage is induced in the second package 220 during joining the first and second packages 200 and 220, and during forming of the bonding structures 226, and thus the periphery region 224b of the second package 220 may be bent. In some embodiments, the periphery region 224b of the second package 220 is bent toward the first package 200 and thereby may result in a compression force from the first package 200 during the bonding. The compression force exerted in the peripheral region 224b can unduly deform the solder layer of the bonding structures, causing solder bridging or bump bridging. It is worth noting that the first and second baffle structures 210c and 210c', which are formed in the periphery region 224b, provide reinforcement against the compression force from the first package 200. Therefore, the bonding structures near the periphery region 224b may avoid being squeezed by the compression force, and thus bump bridge issue is mitigated.

In some embodiments, a mechanical strength of the first and second baffle structures 210c and 210c' is sufficient to resist the compression force from the first package 200. However, the height Hb1 and Hb1' of the first and second baffle structures 210c and 210c' may be reduced to a height Hb2 and Hb2' after the bonding. In some embodiments, the height Hb2 and Hb2' of the first and second baffle structures 210c and 210c' is less than a spacing distance between the first package 200 and the second package 220 after the bonding. In some embodiments, the height Hb2 and Hb2' of the first and second baffle structures 210c and 210c' is less than a height of the connectors after the bonding. In some embodiments, the first baffle structures 210c include a consistent height Hb2 and the second baffle structure s210c' include a consistent height Hb2' after the bonding. In some embodiments, the height Hb2 and Hb2' of the first and second baffle structures 210c and 210c' after the bonding is not consistent. For example but not limited thereto, the height Hb2 and Hb2' of a side of the first and second baffle structures 210c and 210c' facing the connectors is greater than the height Hb2 and Hb2' of a side of the first and second baffle structures 210c and 210c' opposite to the connectors, as shown in FIG. 6B.

Referring to FIG. 6C, an underfill 240 is injected or applied into a space 232 between the first package 200, the second package 220, the connectors, the first baffle structures 210c and the second baffle structures 210c'. The underfill 240 is injected to fill the space 232 in order to reduce stress exerted on the bonded structures after the bonding. In some embodiments, the underfill 240 covers not only the first surface 202a of the first package 200 and the third surface 222a of the second package 220, but also surfaces of the connectors 230 and surfaces of the baffle structures 210c/210c', as shown in FIG. 6C. It is worth noting that the first and second baffle structures 210c and 210c' are alternately arranged and separated from each other such that the underfill 240 can be smoothly injected to fill the space 232.

According to the methods for manufacturing the semiconductor package structure 10, 12 and 14, the baffle structures 210a and 210b can be formed over the first surface 202a of the first package 200 or the third surface 222a of the second package 220. The baffle structures 210a, 210b and 210c/210c' are formed to sustain the compression force from the first package 200 or the second package 220, and thus the bump bridge issue can be mitigated.

Figure 10B:
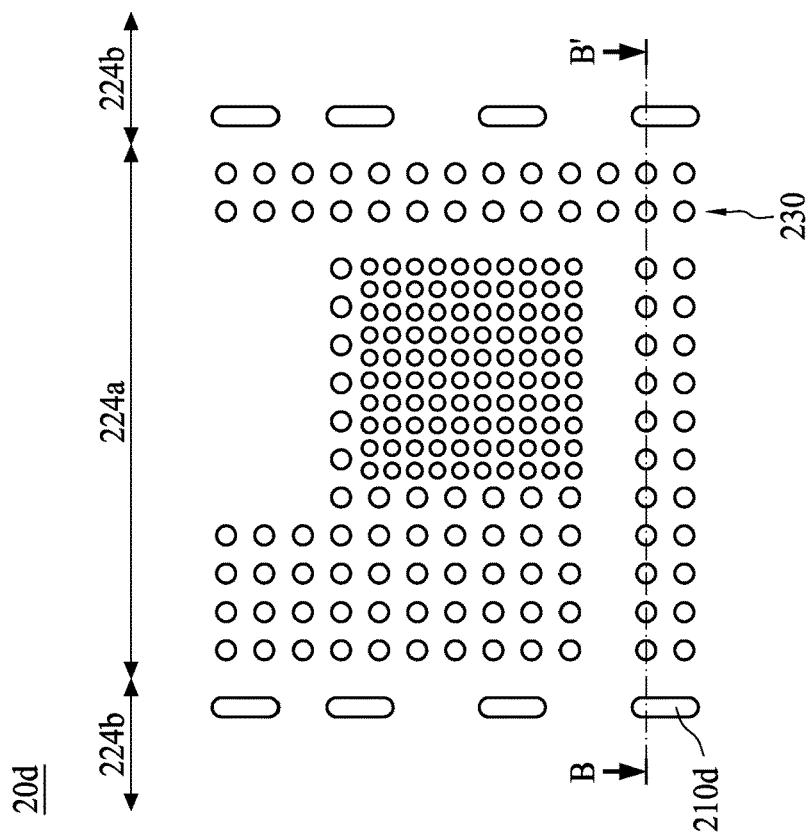
FIGS. 10A to 10D are top views of semiconductor package structures according to aspects of one or more embodiments of the present disclosure.
Figure 10A:
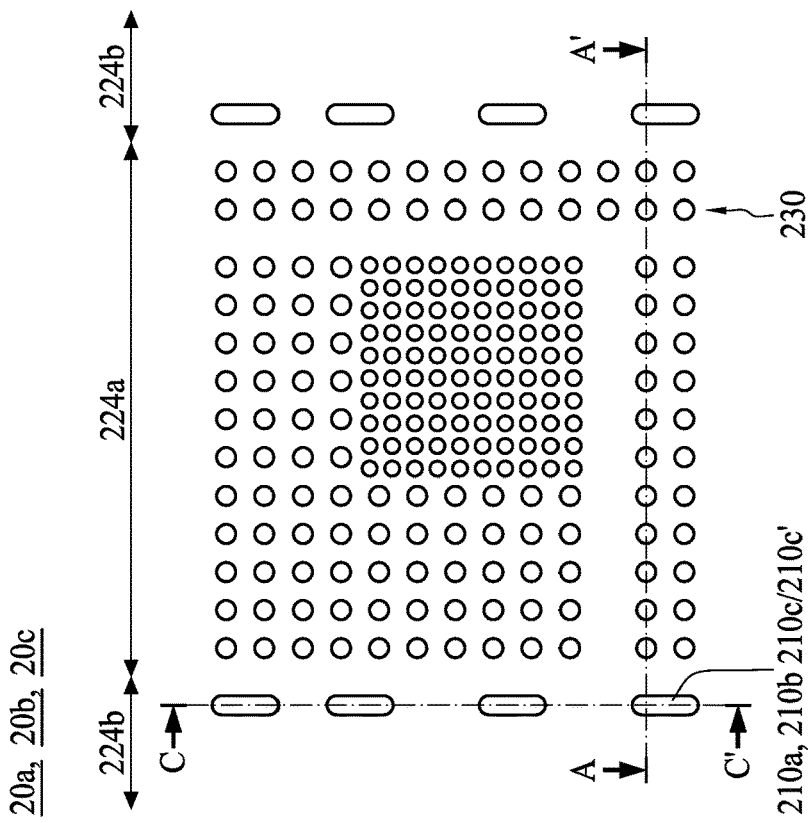

According to the method 10, 12 or 14, a semiconductor package structure 20a, 20b or 20c is provided in some embodiments, as shown in FIGS. 4C, 5C, 6C and 10A, wherein FIGS. 4C, 5C and 6C can be a cross-sectional view taken along line A-A' of FIG. 10A. The semiconductor package structure 20a, 20b or 20c includes the first package 200, the second package 220 over the first package 200, the plurality of connectors 230 between the first package 200 and the second package 220, the plurality of baffle structures 210a, 210b or 210c/210c', and the underfill 240. The second package 220 includes the bonding region 224a and the periphery region 224b. As mentioned above, the periphery region 224b surrounds the bonding region 224a in some embodiments, but the disclosure is not limited thereto. The connectors 230 are disposed in the bonding region 224a for providing electrical connections between the first package 200 and the second package 220 while the baffle structures 210a and 210b are disposed in the periphery region 224b. Further, the baffle structures 210a, 210b and 210c/210c' are formed before joining the first and second packages 200 and 220. As shown in FIGS. 4C, 5C and 6C, the baffle structures 210a, 210b and 210c/210c' are in contact with both of the first package 200 and the second package 220. In some embodiments, the baffle structures 210a, 210b and 210c/210c' include insulating materials.

Still referring to FIGS. 4C, 5C and 6C, it is worth noting that the baffle structures 210a, 210b and 210c/210c' are separated from each other by the underfill 240. In some embodiments, the baffle structures 210a, 210b and 210c/210c' are also separated from the connector structures 230 by the underfill 240, as shown in FIGS. 4C and 5C. In other words, the underfill 240 is between the first package 200, the second package 220, adjacent connectors 230, and adjacent baffle structures 210a, 210b and 210c/210c'. In some embodiments, a spacing distance d1 between two adjacent connectors 230 is greater than a spacing distance d2 between a baffle structure 210a and an adjacent connector 230. In some embodiments, the spacing distance d1 between two adjacent connectors 230 is less than 100 μm, but the disclosure is not limited thereto.

Still referring to FIGS. 4C, 5C and 6C, in some embodiments, the plurality of baffle structures 210a, 210c and 210c/210c' are made of conductive materials. The baffle structures 210a, 210c and 210c/210c' including conductive materials can be formed before or after forming the pre-solder layer 206 or the bonding structures 226, but before joining the first and second packages 200 and 220. As shown in FIGS. 4C, 5C and 6C, the baffle structures 210a, 210b and 210c/210c' are separated from each other by the underfill 240. Further, the baffle structures 210a, 210c and 210c/210c' are electrically isolated from the connectors 230 by the underfill 240, and thus do not impact the electrical performance of the semiconductor package structures 20a, 20b and 20c. In some embodiments, a spacing distance d1 between two adjacent connectors 230 is greater than a spacing distance d2 between a baffle structure 210d and an adjacent connector 230, as shown in FIGS. 4C, 5C and 6C.

Figure 7:
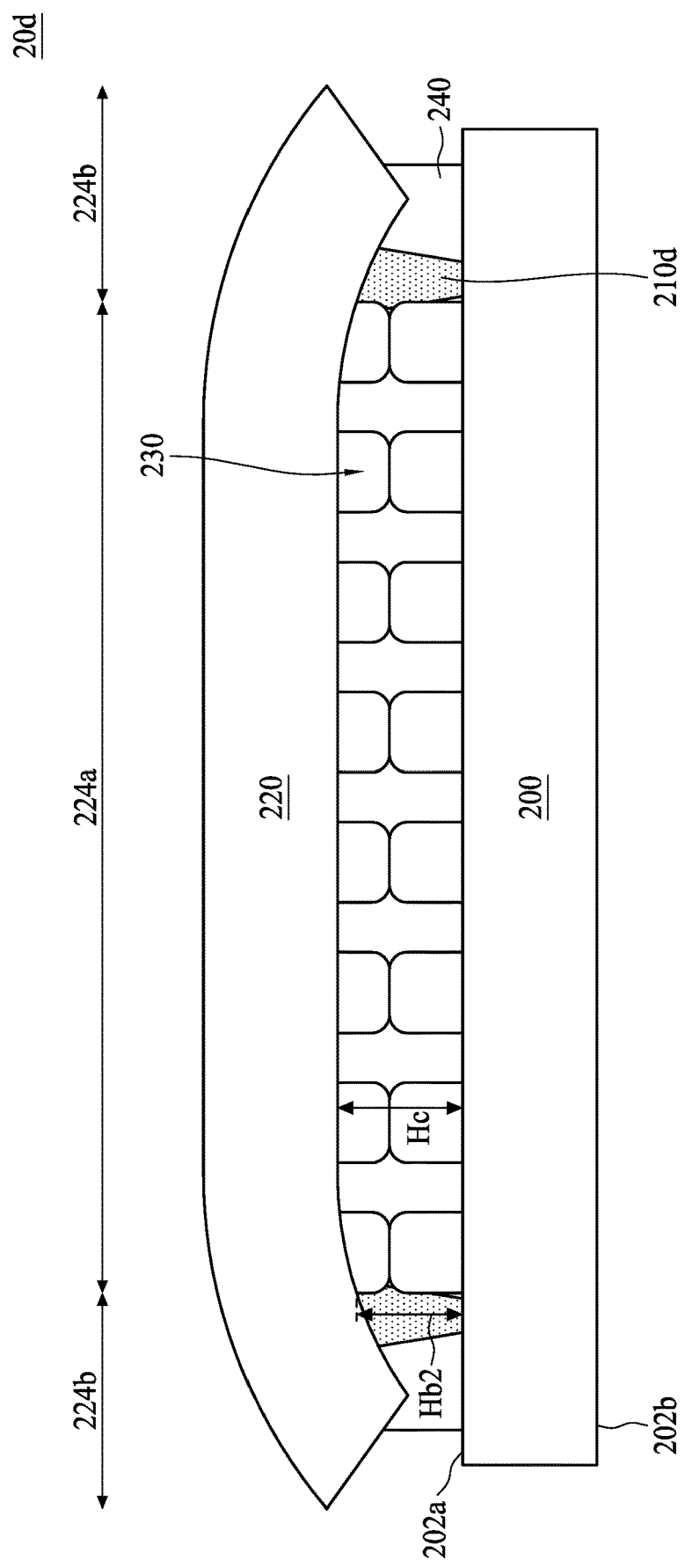
FIG. 7 is a schematic drawing illustrating a semiconductor package structure according to aspects of one or more embodiments of the present disclosure.

FIG. 7 is a schematic drawing illustrating a semiconductor package structure 20d according to aspects of one or more embodiments of the present disclosure. It should be noted that similar elements in FIGS. 4C, 5C, 6C and 7 are designated by the same numerals. Further, similar elements in FIGS. 4C, 5C, 6C and 7 can include similar materials and can be formed by similar steps; therefore, such redundant details are omitted in the interest of brevity, and only the differences are mentioned. Additionally, FIG. 7 can be a cross-sectional view taken along line B-B' of FIG. 10B. In some embodiments, the difference between the semiconductor package structure 20a/20b/20c and the semiconductor package structure 20d is that the baffle structures 210a, 210b and 210c/210c' of the semiconductor package structures 20a, 20b and 20c are separated from the connectors 230, while semiconductor package structure 20d includes a plurality of baffle structures 210d in contact with the connectors 230. In some embodiments, at least one of the baffle structures 210d is in contact with at least one adjacent connector 230 in the bonding region 224a. In some embodiments, the baffle structures 210d include insulating materials, and thus there is no effect caused by contact between the baffle structure 210d and the connector 230, as shown in FIG. 7. In addition, as shown in FIG. 10B, the baffle structures 210d are separated from each other such that the underfill 240 can be smoothly injected during the manufacturing operation. As mentioned above, the baffle structures 210d can be separated from each other by the underfill 240.

Still referring to FIG. 7, in some embodiments, the baffle structures 210d can include conductive materials. In those embodiments each baffle structure 210d is in contact with single connector 230. Since the baffle structures 210d are separated from each other, no short circuit will be formed due to the contact between the baffle structure 210d and the single connector 230.

Figure 8:
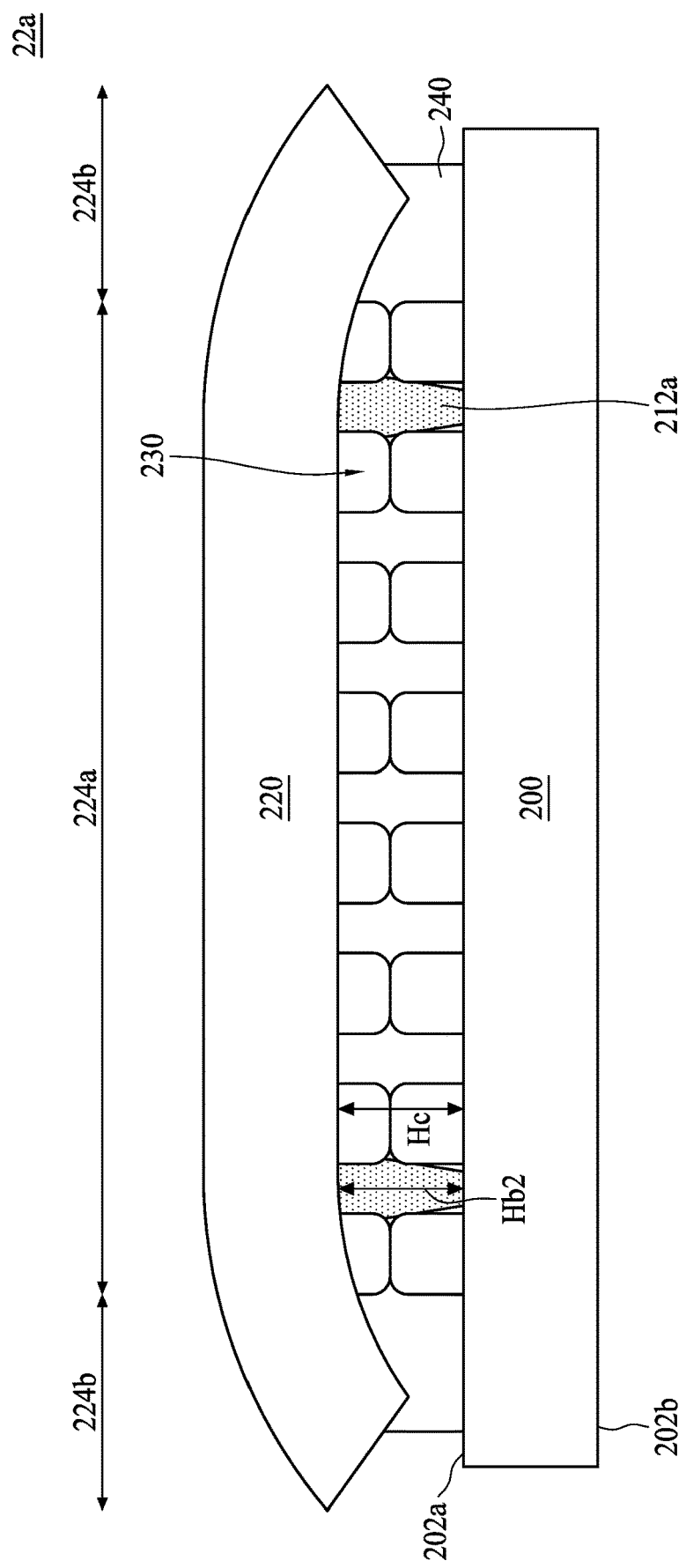
FIG. 8 is a schematic drawing illustrating a semiconductor package structure according to aspects of one or more embodiments of the present disclosure.
Figure 10C:
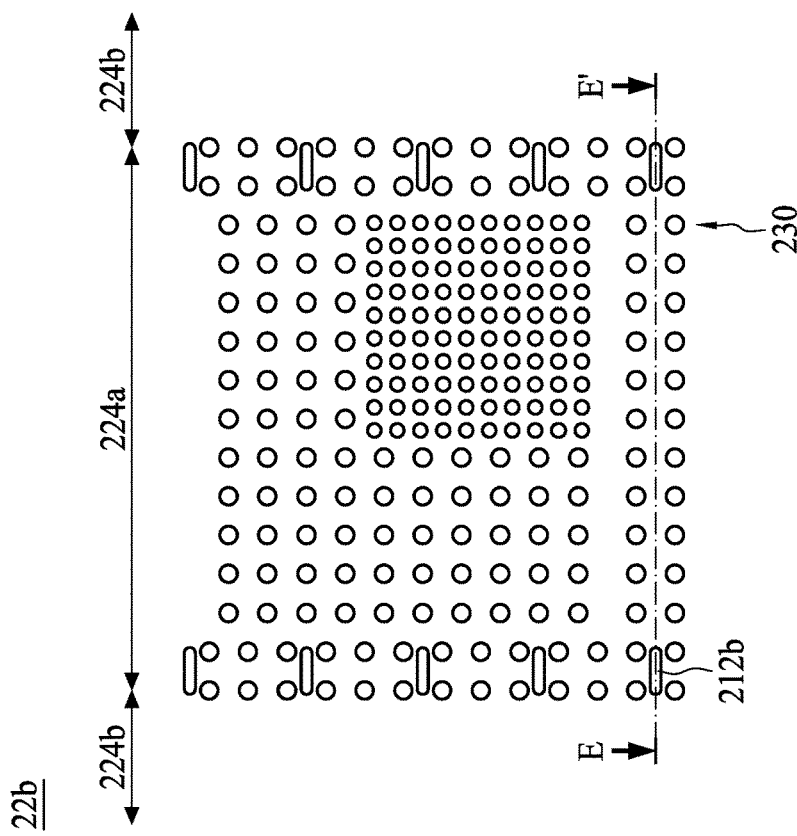

FIG. 8 is a schematic drawing illustrating a semiconductor package structure 22a according to aspects of one or more embodiments of the present disclosure. It should be noted that similar elements in FIGS. 4C, 5C, 6C and 8 are designated by the same numerals. Further, similar elements in FIGS. 4C, 5C, 6C and 8 can include similar materials and can be formed by similar steps; therefore, such redundant details are omitted in the interest of brevity, and only the differences are mentioned. Additionally, FIG. 8 can be a cross-sectional view taken along line D-D' of FIG. 10C. In some embodiments, the difference between the semiconductor package structure 20a/20b/20c and the semiconductor package structure 22a is that the semiconductor package structures 20a, 20b and 20c include the plurality of baffle structures 210a, 210b and 210c/210c' disposed in the periphery region 224b while the semiconductor package structure 22a includes a plurality of baffle structures 212a disposed in the bonding region 224a, as shown in FIGS. 8 and 10C. As shown in FIGS. 8 and 10C, the baffle structures 212a are separated from each other. In some embodiments, the baffle structures 212a are separated from each other by the underfill 240. However, in some embodiments, at least one of the baffle structures 212a is in contact with at least two adjacent connectors 230 in the bonding region 224a. It is worth noting that since the baffle structures 212a are disposed between the two adjacent connectors 230, the bump material is prevented from bridging during the reflow operation. Further, the baffle structures 212a can include insulating materials, and thus there is no effect caused by contact between the baffle structure 212a and the connector 230, as shown in FIG. 8. In addition, the baffle structures 212a are separated from each other such that the underfill 240 can be smoothly injected during the manufacturing operation.

Figure 9:
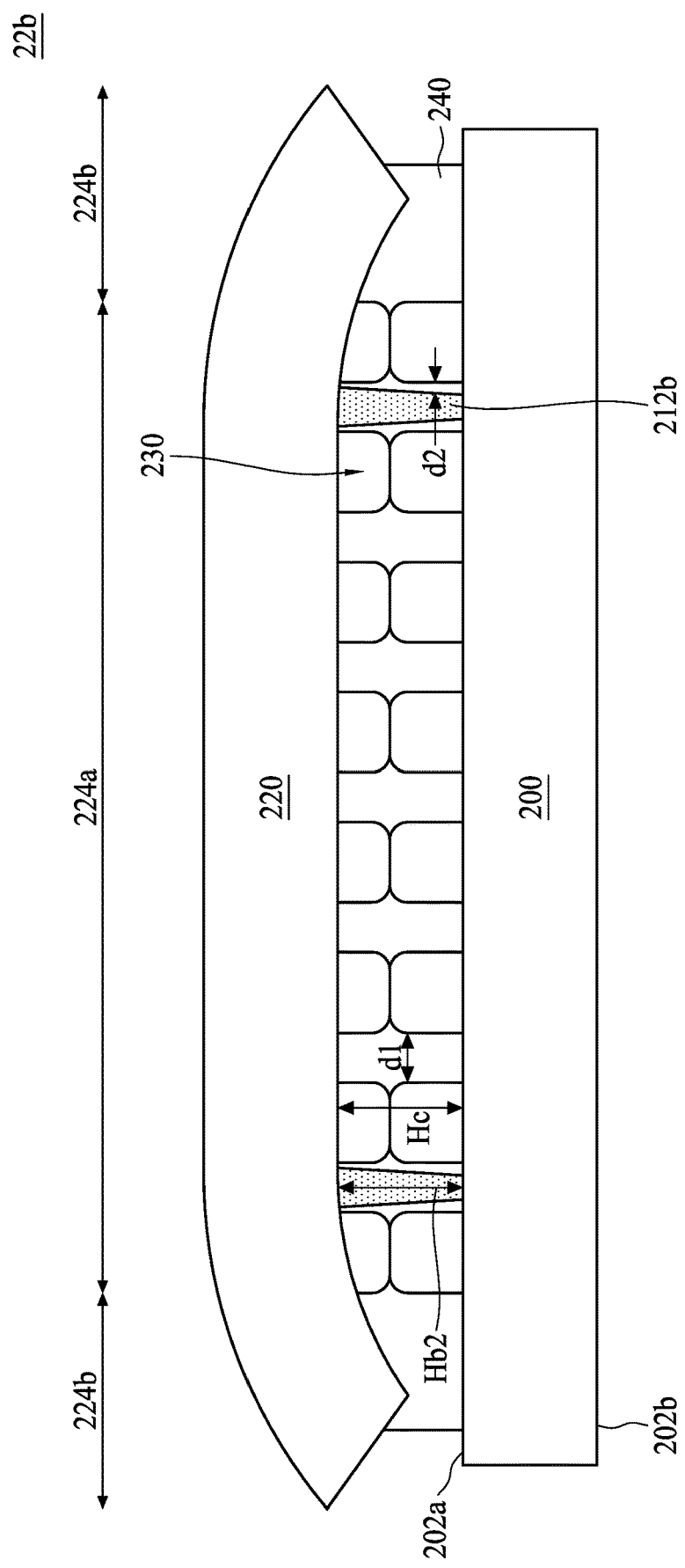
FIG. 9 is a schematic drawing illustrating another semiconductor package structure according to aspects of one or more embodiments of the present disclosure.
Figure 10D:
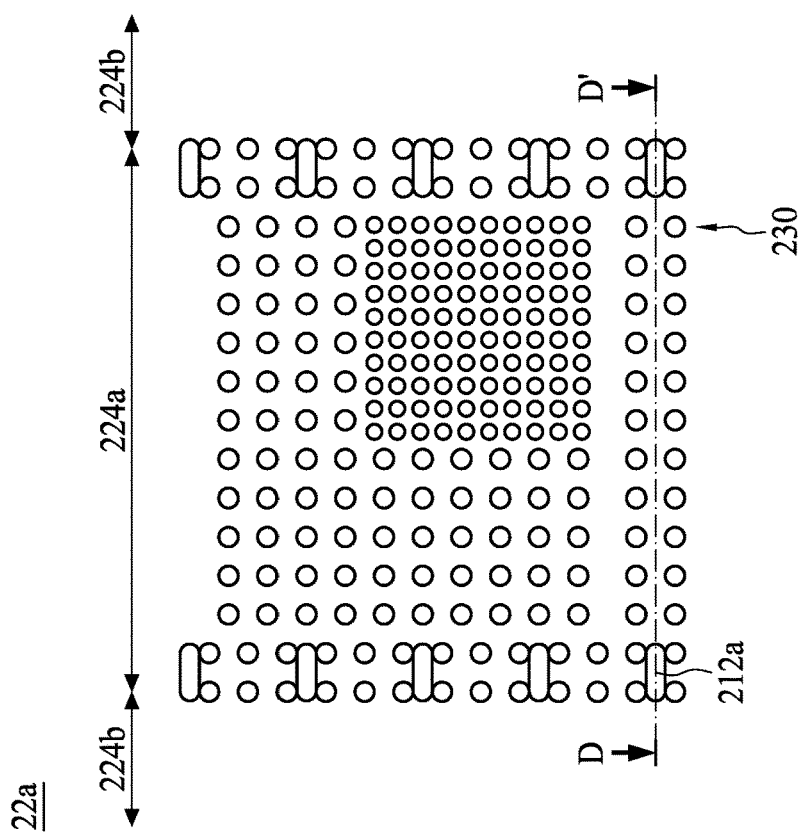

FIG. 9 is a schematic drawing illustrating a semiconductor package structure 22b according to aspects of one or more embodiments of the present disclosure. It should be noted that similar elements in FIGS. 8 and 9 are designated by the same numerals. Further, similar elements in FIGS. 8 and 9 can include similar materials and can be formed by similar steps; therefore, such redundant details are omitted in the interest of brevity, and only the differences are mentioned. Additionally, FIG. 9 can be a cross-sectional view taken along line E-E' of FIG. 10D. In some embodiments, the difference between the semiconductor package structure 22a and the semiconductor package structure 22b is that the semiconductor package structure 22a includes the plurality of baffle structures 212a in contact with the connectors 230 while the semiconductor package structure 22b includes a plurality of baffle structures 212b disposed in the bonding region 224a but separated from the connectors 230, as shown in FIG. 9. In other words, the baffle structures 212b are not only separated from each other but are also separated from the adjacent connectors 230. In some embodiments, the baffle structures 212b are separated from each other and from the adjacent connectors 230 by the underfill 240, but the disclosure is not limited thereto. In some embodiments, a spacing distance d1 between two adjacent connectors 230 is greater than a distance d2 between the baffle structure 212b and the adjacent connector 230, as shown in FIG. 9. It is worth noting that since the baffle structures 212b are disposed between the two adjacent connectors 230, it obstructs the bump material from bridging during the reflow operation. Further, the baffle structures 212a are separated from each other and from the connectors 230, such that the underfill 240 can be smoothly injected during the manufacturing operation. In some embodiments, the baffle structures 212b can include insulating materials. In other embodiments, the baffle structures 212b can include conductive materials.

FIGS. 10A to 10D are top views of semiconductor package structures according to aspects of one or more embodiments of the present disclosure. In the following description of the relationship between the connectors 230 and the baffle structures 210, some elements such as the first package 200, the second package 220 and the underfill 240 are omitted, but those skilled in the art can easily understand the spatial arrangements for those elements according to FIGS. 4C, 5C, 6C and 7-9. As shown in FIGS. 10A to 10D, the shape of the baffle structures 210 (including 210a, 210b, 210c/210c' and 210d) and 212 (including 212a and 212b) can be different from the shape of the connectors 230, but the disclosure is not limited thereto. In some embodiments, a length of the baffle structures 210 and 212 is greater than a diameter of the plurality of connectors 230, but the disclosure is not limited thereto. As those skilled in the art can easily realize, other shapes, patterns and arrangements can be adopted to meet different product requirements.

The present disclosure provides a semiconductor package structure including the plurality of baffle structures on either the first package or the second package, or on both of the first and second packages. The baffle structures on one package provide reinforcement against compression force from the other package during the bonding operation. In some embodiments, the bonding operation includes reflow. However, other operation such as thermal compression bonding (TCB) can be used. Accordingly, the bump bridging issue is mitigated. The baffle structures can include any possible materials. Further, the baffle structures are separated from each other such that the underfill can be smoothly injected to fill the space between the first package, the second package, the connectors and the baffle structures.

In some embodiments, a semiconductor package structure is provided. The semiconductor package structure includes a first package, a second package over the first package, a plurality of connectors between the first package and the second package, and a plurality of baffle structures between the first package and the second package. The second package includes a bonding region and a periphery region surrounding the bonding region. The connectors are disposed in the bonding region to provide electrical connections between the first package and the second package. The baffle structures are disposed in the periphery region and are separated from each other.

In some embodiments, a semiconductor package structure is provided. The semiconductor package structure includes a first package, a second package over the first package, a plurality of connectors between the first package and the second package, and a plurality of baffle structures between the first package and the second package. The second package includes a bonding region and a periphery region surrounding the bonding region, and the connectors and the baffle structures are disposed in the bonding region. The baffle structures are disposed between two adjacent connectors, and are separated from each other.

In some embodiments, a method for manufacturing a semiconductor package structure is provided. The method includes the following operations. A first package is provided. The first package includes a first surface and a second surface opposite to the first surface. A second package is provided. The second package includes a third surface and a fourth surface opposite to the third surface. A plurality of baffle structures are provided between the first package and the second package. The first surface of the first package is then bonded to the third surface of the second package by a plurality of connectors between the first package and the second package. After the bonding operation, a height of the plurality of baffle structures is less than a height of the plurality of connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure comprising:
   a first package;
   a second package over the first package and comprising a bonding region and a periphery region surrounding the bonding region, wherein the second package has an active surface facing the first package and an inactive surface opposite to the active surface, and the active surface and the inactive surface are concave surfaces;
   a plurality of connectors between the first package and the second package in the bonding region, wherein the plurality of connectors provide electrical connections between the first package and the second package;
   a plurality of baffle structures between the first package and the second package, wherein the plurality of baffle structures are in contact with both of the first package and the second package, the plurality of baffle structures have a first side facing the plurality of connectors and a second side opposite to the first side, and a first height of the first side of the plurality of baffle structures is greater than a second height of the second side of the plurality of baffle structures; and an underfill between the first package, the second package, adjacent to the plurality of connectors, and adjacent to the plurality of baffle structures, wherein the plurality of baffle structures are disposed in the periphery region of the second package and are separated from each other, a height of the plurality of baffle structures is less than a spacing distance between the first package and the second package in the bonding region, and a value of Young's modulus of the plurality of baffle structures is different from a value of Young's modulus of the plurality of the connectors.

2. The semiconductor package structure of claim 1, wherein the plurality of baffle structures comprise insulating materials.

3. The semiconductor package structure of claim 1, wherein the plurality of baffle structures comprise conductive materials.

4. The semiconductor package structure of claim 3, wherein the plurality of baffle structures are isolated from the plurality of connectors by the underfill.

5. The semiconductor package structure of claim 3, wherein a spacing distance between two adjacent connectors is greater than a spacing distance between a baffle structure and an adjacent connector.

6. The semiconductor package structure of claim 1, wherein at least a length of the plurality of baffle structures is greater than a diameter of the plurality of connectors.

7. The semiconductor package structure of claim 1, wherein the height of the plurality of baffle structures is less than a height of the plurality of connectors.

8. The semiconductor package structure of claim 1, wherein the height of the plurality of baffle structures is less than a thickness of the underfill.

9. A method for manufacturing a semiconductor package structure, comprising:
provided a first substrate comprising a first surface and a second surface opposite to the first surface;
providing a second substrate comprising a third surface and a fourth surface opposite to the third surface;
providing a plurality of baffle structures between the first substrate and the second substrate; and
bonding the first surface of the first substrate to the third surface of the second substrate by a plurality of connectors disposed between the first substrate and the second substrate, wherein a first height of the plurality of baffle structures is reduced to a second height of the plurality of baffle structures after the bonding and the second height of the plurality of baffle structures is less than a height of the plurality of connectors after the bonding.

10. The method of claim 9, wherein the plurality of baffle structures are disposed on the first surface of the first substrate before bonding.

11. The method of claim 9, wherein the plurality of baffle structures are disposed on the third surface of the second substrate before bonding.

12. The method of claim 9, wherein the plurality of baffle structures comprise insulating materials.

13. The method of claim 9, wherein the plurality of baffle structures comprise conductive materials.

14. The method of claim 9, further comprising disposing an underfill to a space between the first substrate, the second substrate, the plurality of connectors and the plurality of baffle structures.

15. The method of claim 14, wherein the second height of the plurality of baffle structures is less than a thickness of the underfill.

16. A semiconductor package structure comprising:
a first package;
a second package over the first package and comprising a bonding region and a periphery region surrounding the bonding region;
a plurality of connectors between the first package and the second package in the bonding region, wherein the plurality of connectors provide electrical connections between the first package and the second package;
a plurality of insulating baffle structures between the first package and the second package, wherein the plurality of insulating baffle structures are in contact with both of the first package and the second package; and
an underfill between the first package, the second package, adjacent to the plurality of connectors, and adjacent to the plurality of insulating baffle structures, wherein the plurality of insulating baffle structures are disposed in the periphery region of the second package and are separated from each other, at least one of the plurality of insulating baffle structures is in contact with at least one of the plurality of connectors, a height of the plurality of insulating baffle structures is less than a spacing distance between the first package and the second package in the bonding region, and a value of Young's modulus of the plurality of insulating baffle structures is different from a value of Young's modulus of the plurality of the connectors.

17. The semiconductor package structure of claim 16, wherein the plurality of insulating baffle structures are separated from each other by the underfill.

18. The semiconductor package structure of claim 16, wherein at least a length of the plurality of insulating baffle structures is greater than a diameter of the plurality of connectors.

19. The semiconductor package structure of claim 16, wherein the height of the plurality of insulating baffle structures is less than a height of the plurality of connectors.

20. The semiconductor package structure of claim 16, wherein the height of the plurality of insulating baffle structures is less than a thickness of the underfill.

* * * * *